(12) United States Patent
Lue et al.

(10) Patent No.: US 11,765,901 B2
(45) Date of Patent: Sep. 19, 2023

(54) 3D FLASH MEMORY AND OPERATION METHOD THEREOF

(71) Applicant: MACRONIX INTERNATIONAL CO., LTD., Hsinchu (TW)

(72) Inventors: Hang-Ting Lue, Hsinchu (TW); Wei-Chen Chen, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 225 days.

(21) Appl. No.: 17/488,128

(22) Filed: Sep. 28, 2021

(65) Prior Publication Data

US 2023/0097416 A1     Mar. 30, 2023

(51) Int. Cl.
  *G11C 16/10*     (2006.01)
  *H10B 43/27*     (2023.01)
  *G11C 16/26*     (2006.01)
  *G11C 16/16*     (2006.01)
  *H10B 41/27*     (2023.01)

(52) U.S. Cl.
  CPC ............. *H10B 43/27* (2023.02); *G11C 16/10* (2013.01); *G11C 16/16* (2013.01); *G11C 16/26* (2013.01); *H10B 41/27* (2023.02)

(58) Field of Classification Search
  CPC ...................................................... G11C 16/10
  See application file for complete search history.

(56) References Cited

U.S. PATENT DOCUMENTS

| | | | |
|---|---|---|---|
| 7,061,805 B2 | 6/2006 | Hung et al. | |
| 8,072,813 B2 | 12/2011 | Lue et al. | |
| 8,456,911 B2 | 6/2013 | Yuan et al. | |
| 10,923,502 B2 | 2/2021 | Sato | |
| 11,133,329 B2 | 9/2021 | Lue | |
| 2020/0388650 A1* | 12/2020 | Nardi | H10N 70/8613 |
| 2021/0288070 A1 | 9/2021 | Choi | |

FOREIGN PATENT DOCUMENTS

| | | |
|---|---|---|
| CN | 113196485 A | 7/2021 |
| TW | 200616211 A | 5/2006 |
| TW | 200907979 A | 2/2009 |
| TW | 201308335 A | 2/2013 |
| TW | 202111925 A | 3/2021 |

* cited by examiner

*Primary Examiner* — Jason Lappas
(74) *Attorney, Agent, or Firm* — McClure, Qualey & Rodack, LLP

(57) ABSTRACT

Disclosed is 3D flash memory comprises a gate stack structure, an annular channel pillar, a first source/drain pillar, a second source/drain pillar and a charge storage structure. The gate stack structure is disposed on a dielectric base, and comprising a plurality of gate layers electrically insulated from each other. The annular channel pillar is disposed on the dielectric base and penetrating through the gate stack structure. The first source/drain pillar and the second source/drain pillar, disposed on the dielectric base, located within the annular channel pillar and penetrating through the gate stack structure, wherein the first source/drain pillar and the second source/drain pillar are separated from each other and are each connected to the annular channel pillar. The charge storage structure is disposed between each of the plurality of gate layers and the annular channel pillar. The first source/drain pillar and the second source/drain pillar are P-type doped.

13 Claims, 8 Drawing Sheets

3D FLASH MEMORY AND OPERATION METHOD THEREOF

BACKGROUND OF THE INVENTION

Field of the Invention

The invention relates to a 3D flash memory and an operation method thereof.

Description of the Related Art

A non-volatile memory (such as a flash memory) is a memory widely used in personal computers and other electronic devices because it has an advantage that the stored data does not disappear after being powered off. The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY OF THE INVENTION

According to an embodiment of the present invention, 3D flash memory comprises a gate stack structure, an annular channel pillar, a first source/drain pillar, a second source/drain pillar and a charge storage structure. The gate stack structure is disposed on a dielectric base, and comprising a plurality of gate layers electrically insulated from each other. The annular channel pillar is disposed on the dielectric base and penetrating through the gate stack structure. The first source/drain pillar and the second source/drain pillar, disposed on the dielectric base, located within the annular channel pillar and penetrating through the gate stack structure, wherein the first source/drain pillar and the second source/drain pillar are separated from each other and are each connected to the annular channel pillar. The charge storage structure is disposed between each of the plurality of gate layers and the annular channel pillar. The first source/drain pillar, the second source/drain pillar, the charge storage structure, the annular channel pillar and the gate layers form a plurality of memory units.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
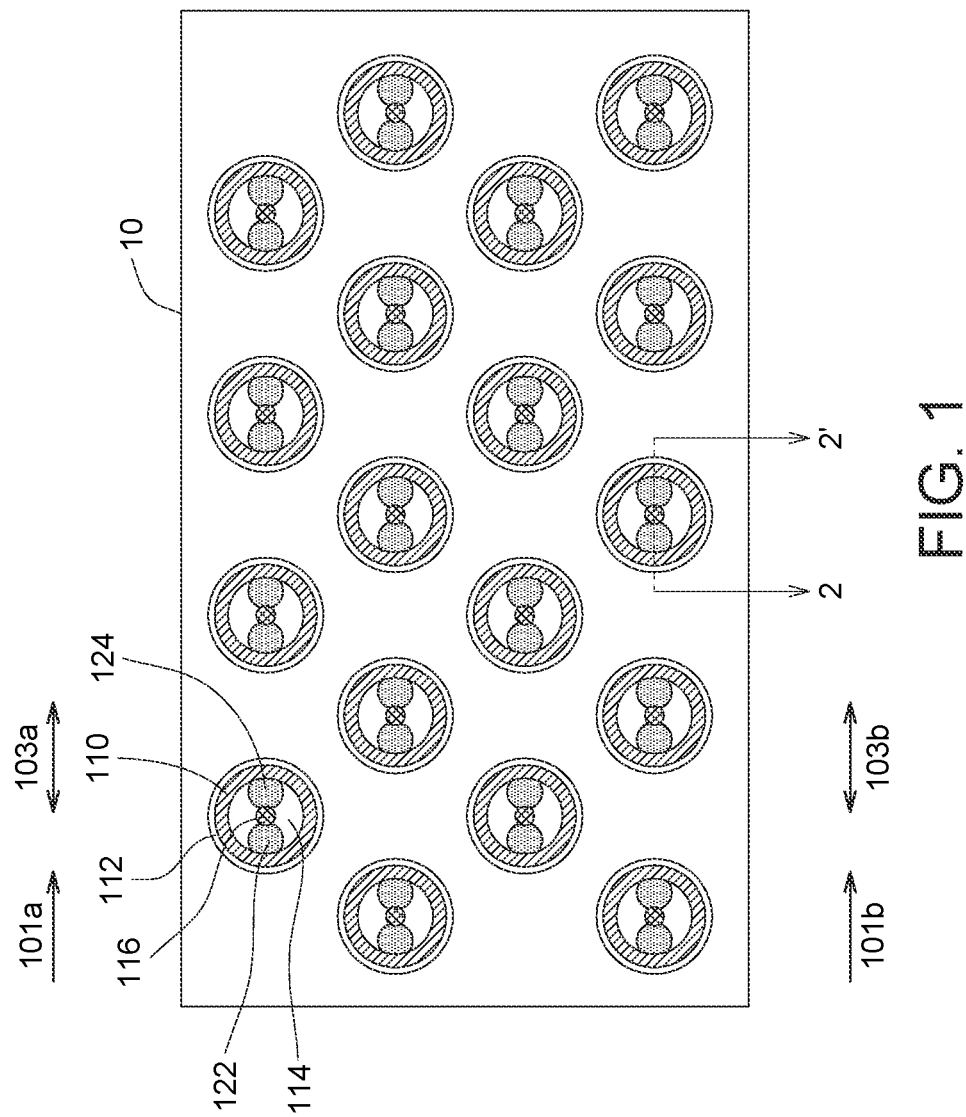
FIG. 1 shows a schematic top view of a 3D flash memory according to an embodiment of the present invention.
Figure 2:
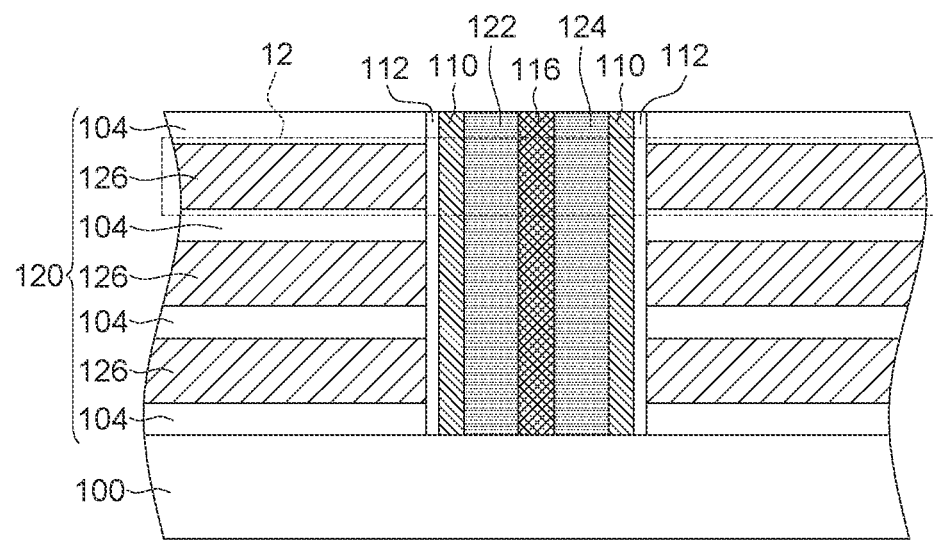
FIG. 2 shows a cross-sectional view (AA in FIG. 1) of a 3D flash memory according to an embodiment of the present invention.
Figure 3:
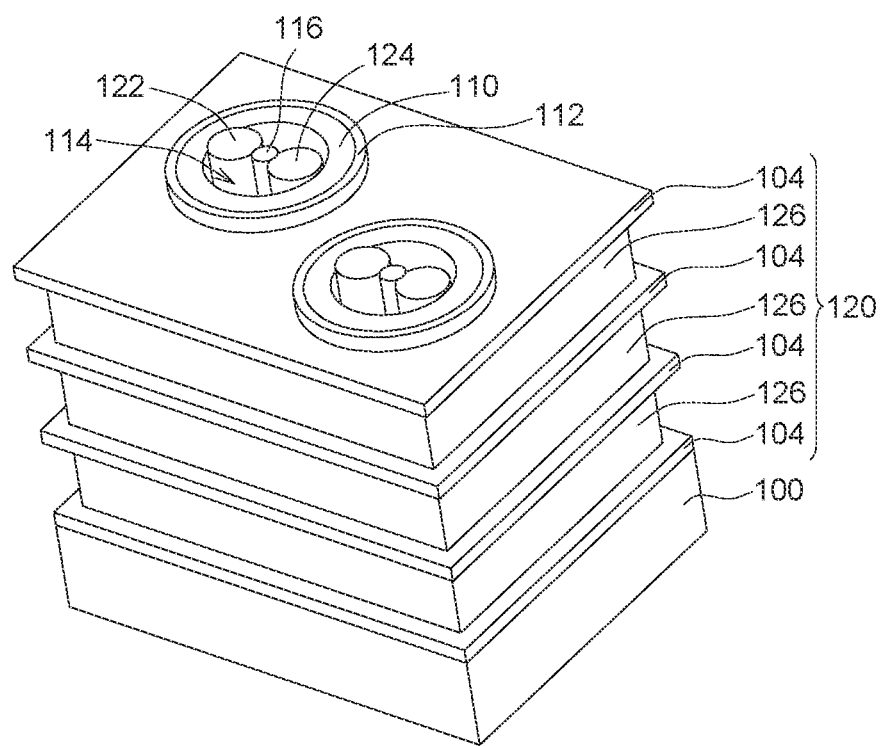
FIG. 3 is a schematic stereogram of a 3D flash memory according to an embodiment of the present invention.

Referring to FIGS. 1, 2 and 3, FIG. 1 shows a schematic top view of a 3D flash memory according to an embodiment of the present invention, FIG. 2 shows a cross-sectional view (2-2' in FIG. 1) of a 3D flash memory according to an embodiment of the present invention, and FIG. 3 is a schematic stereogram of a 3D flash memory according to an embodiment of the present invention. The 3D flash memory 10 includes a gate stack structure 120, an annular channel pillar 110, a first source/drain pillar 122, a second source/drain pillar 124 and a charge storage structure 112. The gate stack structure 120 is disposed on a dielectric base 100 and includes a plurality of gate layers 126 electrically insulated from each other by a plurality of insulation layers. The annular channel pillar 110 is disposed on the dielectric base 100 and penetrates through the gate stack structure 120. The first source/drain pillar 122 and the second source/drain pillar 124 are disposed on the dielectric base 100, are located within the annular channel pillar 110, and penetrate through the gate stack structure 120. The first source/drain pillar 122 and the second source/drain pillar 124 are separated from each other by an insolation pillar 116, and are each connected to the annular channel pillar 110. The charge storage structure 112 is disposed between each of the plurality of gate layers 126 and the annular channel pillar 110. The charge storage structure 112 could be oxide-nitride-oxide (ONO), oxide-nitride-oxide-nitride-oxide (ONONO), band-gap engineered silicon-oxide-nitride-oxide-silicon (BE-SONOS), metal-aluminum oxide-nitride-oxide-silicon (MANOS) and so on. An insulation material 114 is disposed/filled in the space between the annular channel pillar 110, the first source/drain pillar 122 and the second source/drain pillar 124. The insolation pillar 116 is, for example, a silicon nitride layer. The first source/drain pillar 122 and the second source/drain pillar 124 are respectively disposed on two opposite sides of the isolation pillar 116 and could be in contact or not in contact with the isolation pillar 116. The 3D flash memory 10 includes a plurality of memory unit 12.

Figure 9:
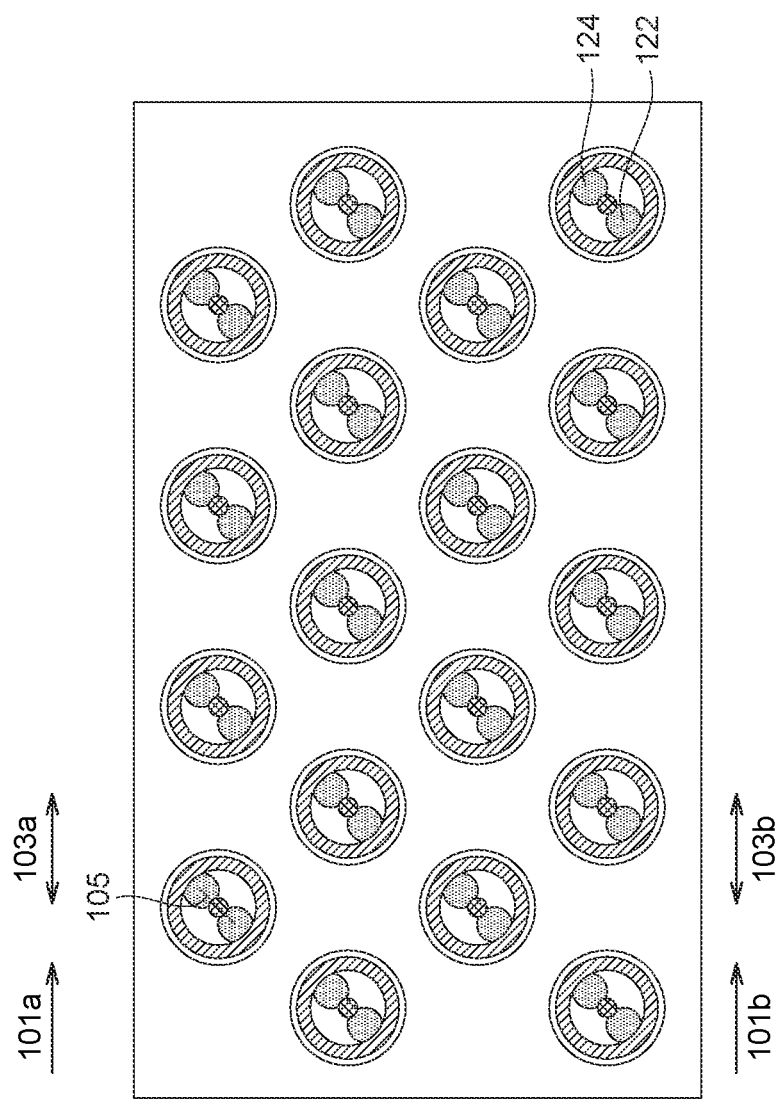
FIG. 9 shows a schematic top view of a 3D flash memory according to an embodiment of the present invention.

In this embodiment, a trench 101a is provided on the upper side of the gate stack structure, and a trench 101b is provided on the lower side of the gate stack structure, and the extension direction 103a of the trench 101a and the extension direction 103b of the trench 101b are parallel. In addition, the connection line 105 between the first source/drain pillar 122 and the second source/drain pillar 124 is parallel to the extending directions 103a and 103b. In an alternative embodiment, as shown in FIG. 9, the connection line 105 between the first source/drain pillar 122 and the second source/drain pillar 124 could not be perpendicular to the extending directions 103a and 103b. For example, there could be an included angle of 45 degrees between the connection line 105 between the first source/drain pillar 122 and the second source/drain pillar 124 and the extending directions 103a and 103b.

Figure 10:
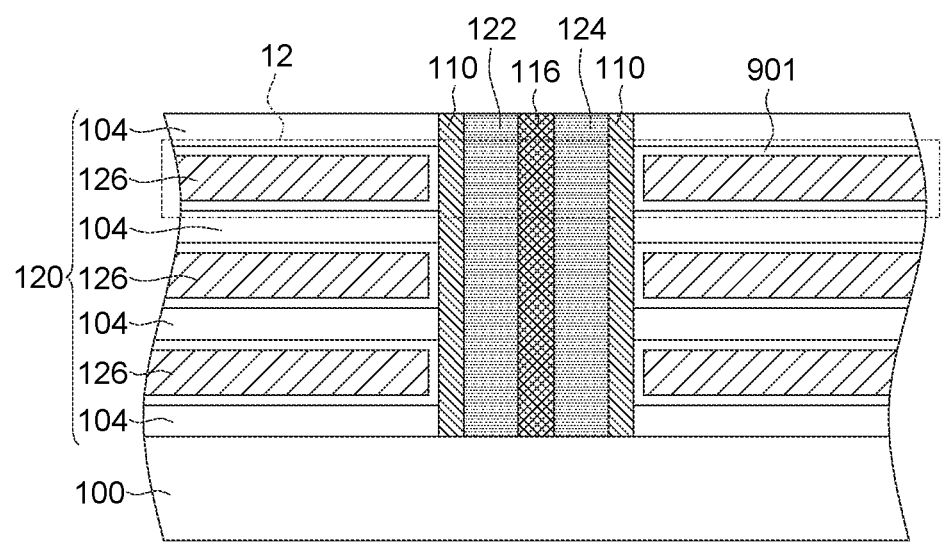
FIG. 10 shows a cross-sectional view of a 3D flash memory according to another embodiment of the present invention.

In another embodiment, as shown in FIG. 10, different from FIG. 2, the charge storage structure 901 could be lining on the interface between the gate layer 126, insulating layer 104, and the annular channel pillar 110. That is, the charge storage structure 901 is not only located between the gate layer 126 as well as the annular channel pillar 110, but also located between the gate layer 126 and the insulating layer 104.

Although the shape of "annular" is an example of circle in the embodiments shown in the figures of the present invention, it should be noted that the shape of "annular" could be regular or irregular ellipse or polygon.

In an embodiment, the material of the first source/drain pillar 122 and the second source/drain pillar 124 is P-type-doped semiconductor, for example, Boron doped Silicon. In this embodiment, the 3D flash memory 10 is a P-type channel AND flash memory. The operation of the 3D flash memory 10 could be performed for the memory units respectively.

Figure 8:
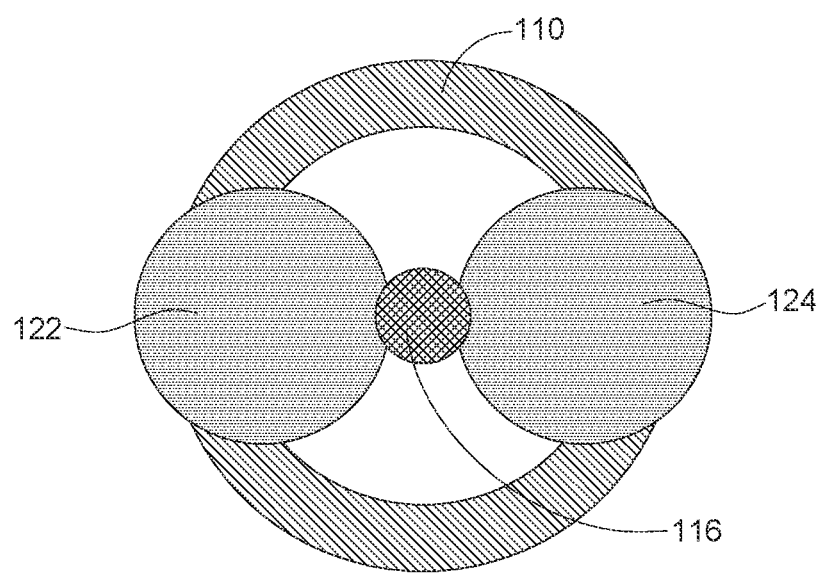
FIG. 8 shows a schematic top view of a memory unit according to another embodiment of the present invention.

In an alternative embodiment, as shown in FIG. 8, a part of the first source/drain pillar 122' and a part of the second source/drain pillar 124' are located within the annular channel pillar 110', and the other part of the first source/drain pillar 122' and the other part of the second source/drain pillar 124' are not located within the annular channel pillar 110'.

Figure 4:
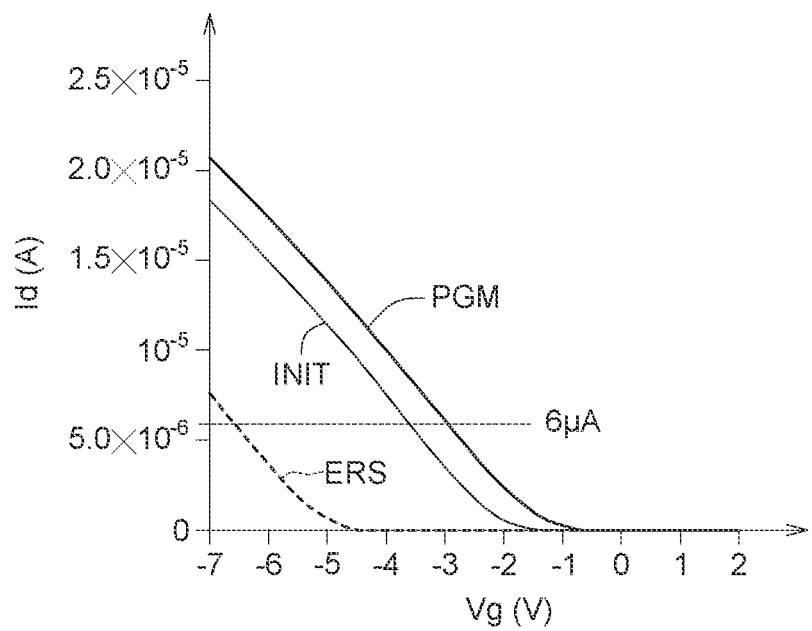
FIG. 4 shows a schematic diagram of the relationship between the gate voltage (Vg) and the drain current (Id) of the memory unit according to an embodiment of the present invention.

Referring to FIG. 4, the schematic diagram of the relationship between the gate voltage (Vg) and the drain current (Id) of the memory unit according to an embodiment of the present invention. In FIG. 4, INIT is a Vg to Id curve of the memory unit which is not programmed or not erased, ERS is a Vg to Id curve of the memory unit which has been erased, and PGM is a Vg to Id curve of the memory unit which has been programmed. −FN (Fowler-Nordhelm) hole injection is applied for the erase operation so that the threshold voltage of the erased memory unit 12 might be configured to lower voltage level. +FN electronic injection is applied for the programming operation so that the threshold voltage of the programmed memory unit 12 might be configured to a high voltage level. From FIG. 4, when a current threshold of a sense amplifier coupled to the drain of the memory unit 12 is 6 uA, the sense amplifier would sense a current larger than 6 uA while the gate voltage of the erased memory unit 12 (without programming) is more negative than −6.5V, and would sense a current larger than 6 uA while the gate voltage of the programmed memory unit 12 is more negative than −2.5V. This means that there is no leakage current while the gate voltage of the programmed memory unit is 0V. The current threshold is used for determining the data stored in the memory unit 12 is a first value (e.g., 1) of a second value (e.g., 0). For example, during the read operation, it could be determined that the memory unit 12 stores the first value while the sense amplifier senses a current larger than the current threshold, and determined that the memory unit 12 stores the second value while the sense amplifier does not sense a current larger than the current threshold.

Figure 5:
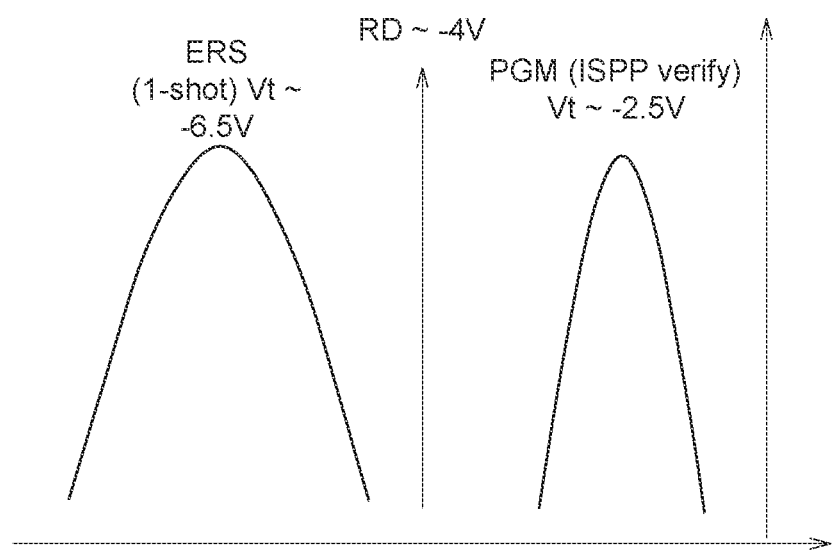
FIG. 5 shows a probability distribution of the threshold voltage of the memory unit.

Referring to FIG. 5, FIG. 5 shows a probability distribution of the threshold voltage of the memory unit. In FIG. 5, the horizontal axis represents threshold voltage, the vertical axis represents probability, ERS is a distribution of the threshold voltage of the erased memory unit 12, and PGM is a distribution of the threshold voltage of the programmed memory unit 12. From FIG. 5, the center of ERS is −6.5V, and the center of PGM is −2.5V. There is 4V difference between the centers of ERS and PGM. A gate voltage for the read operation could be set at the medium value of −6.5V and −2.5V, that is, −4V.

Figure 6:
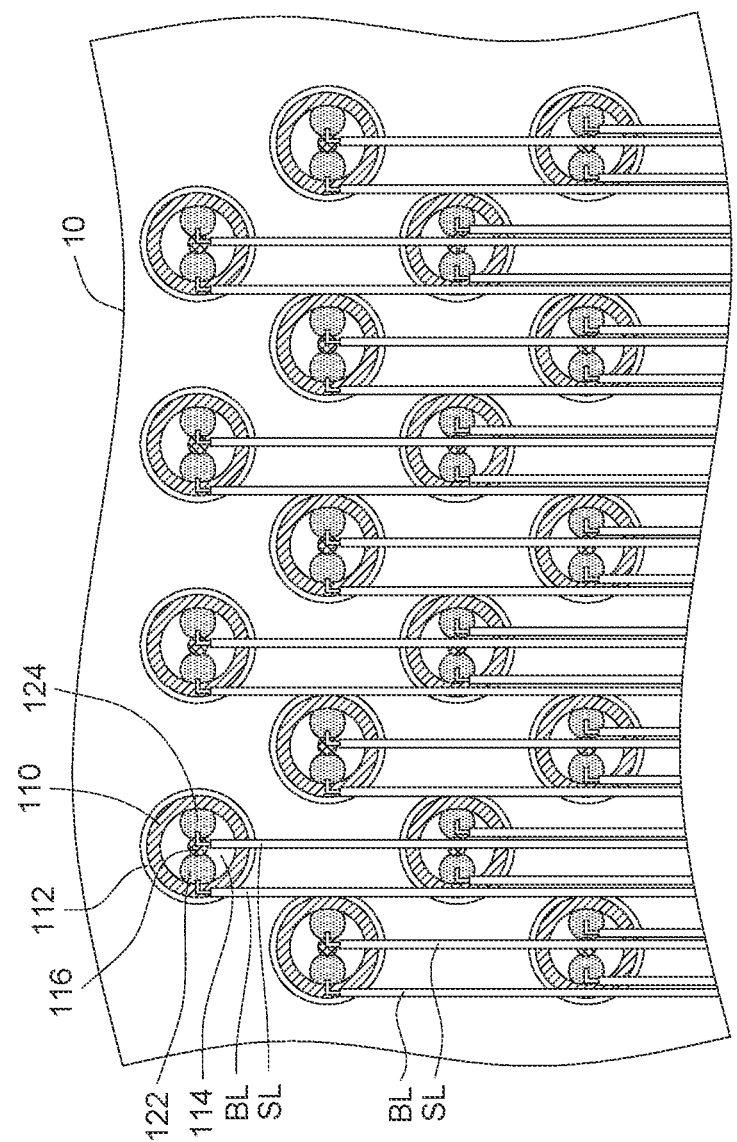
FIG. 6 shows a schematic diagram of an array layout of a 3D flash memory according to a first embodiment of the invention.

Referring to FIG. 6, FIG. 6 shows a schematic diagram of an array layout of a 3D flash memory according to a first embodiment of the invention. The first source/drain pillars 122 are coupled to a plurality of first signal lines respectively. The second source/drain pillars 124 are coupled to a plurality of second signal lines respectively. In one of the embodiments, the first signal lines are bit lines BL, and the second signal lines are source lines SL. The first signal lines and second signal lines are coupled to a plurality of sense amplifiers respectively (not shown). Noted that, the gate layers 126 of the memory units 12 are coupled to a plurality of gate control lines could not be shown since FIG. 6 is a top view. In one of the embodiments, the first signal lines, the second signal lines and the gate control lines could respectively be configured as bit lines (BL), source lines (SL) and word lines (WL). The following description is according to the corresponding relationship above. However, in another one of the embodiments, the first signal lines, the second signal lines and the gate control lines could respectively be configured as source lines (SL), bit lines (BL) and word lines (WL).

Figure 7:
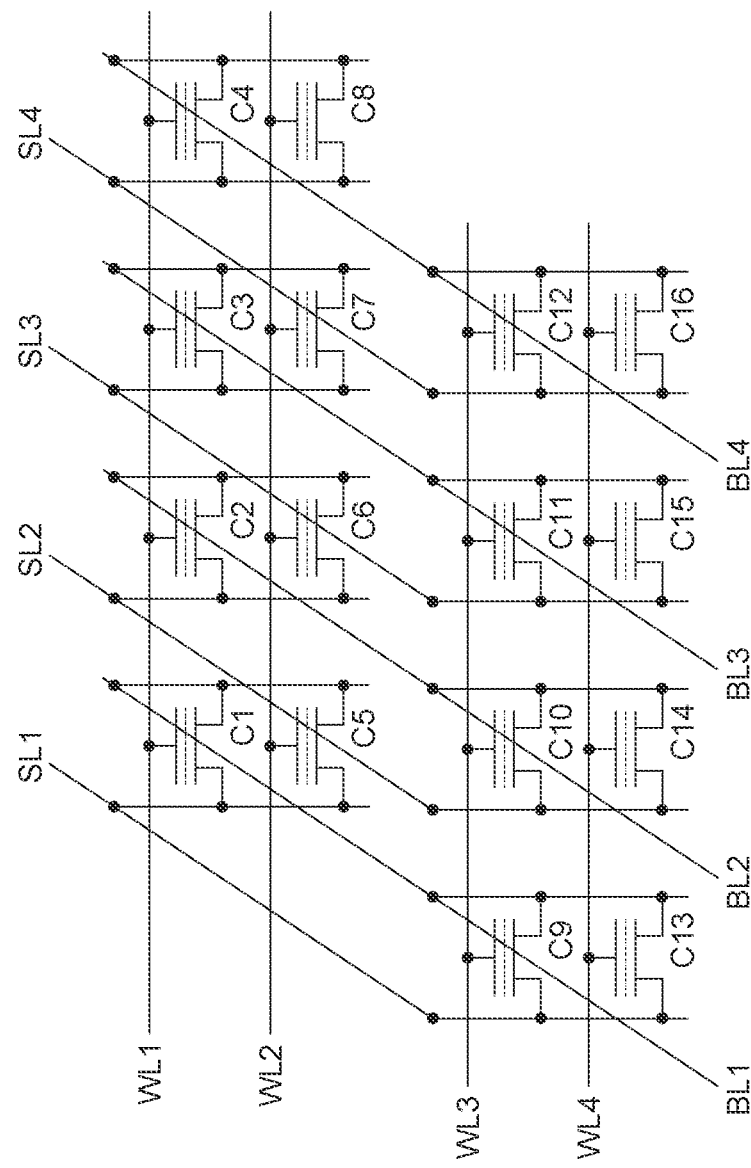
FIG. 7 shows a schematic diagram of a 3D flash memory according to an embodiment of the present invention.

Referring to FIG. 7, FIG. 7 shows a schematic diagram of a 3D flash memory according to an embodiment of the present invention. The circuit structure could be considered as an equivalent circuit of the array layout in FIG. 6. The gates of the adjacent memory units in the X direction share the same word line. The adjacent memory units in the Y direction share the same source line and the same bit line. The adjacent memory units in the Z direction share the same source line and the same bit line. For example, the memory units C1, C2, C3, C4 share the word line WL1. The memory units C5, C6, C7, C8 share the word line WL2. The memory units C9, C10, C11, C12 share the word line WL3. The memory units C13, C14, C15, C16 share the word line WL4. The memory units C1, C5, C9, C13 share the source line SL1 and the bit line BL1. The memory units C2, C6, C10, C14 share the source line SL2 and the bit line BL2. The memory units C3, C7, C11, C15 share the source line SL3 and the bit line BL3. The memory units C4, C8, C12, C16 share the source line SL4 and the bit line BL4. Details of the read operation, the erase operation and the programming operation would be explained based on FIG. 7.

For the read operation, it is assumed that the memory unit C11 is to be read. A first read selected bias (e.g., −4V) is applied to the word line WL3 corresponding to the memory unit C11 to be read, and a first read de-selected bias (e.g., 0V) is applied to the other word lines. A second read selected bias (e.g., −1.8V) is applied to the bit line BL3 corresponding to the memory unit C11 to be read, and the other bit lines are floating. A third read selected bias (e.g., 0V) is applied to the source line SL3 corresponding to the memory unit C11 to be read, and the other source lines are floating. Noted that the first read selected bias is more negative than the second read selected bias.

The erase operation could be performed in units of a sector which includes a plurality of memory units. It is assumed that the sector to be erased includes the memory units C9~C16. A first erase selected bias (e.g., −8V) is applied to the word lines WL3, WL4 corresponding to the memory units C9~C16 to be erased, and a first erase de-selected bias (e.g., 0V) is applied to the other word lines. A second erase selected bias (e.g., 10V) is applied to the source lines SL1~SL4 corresponding to the memory units C9~C16 to be erased. The second erase selected bias (e.g., 10V) is applied to the bit lines BL1~BL4 corresponding to the memory units C9~C16 to be erased. Noted that, the first erase selected bias is negative, and the second erase selected bias is positive. Since this embodiment is P-type channel, there is no concern of over erasing. Therefore, Incremental Step Pulse Programming (ISPP) would not be applied to the erase operation. The erase operation is done by one-shot pulse so that the time required for the erase operation could be shortened. In present embodiment, since the erase operation is performed in units of a sector, the bit lines BL1~BL4 and the source lines SL1~SL4 in the same sector would be applied the same bias. The other bit lines and source lines belong to the sectors which are not selected to be erased could be applied the same bias as the bit lines BL1~BL4 and the source lines SL1~SL4. However, in an alternative embodiment, the other bit lines and source lines belong to the sectors which are not selected could be applied a bias different from the bit lines BL1~BL4 and the source lines SL1~SL4.

For the programming operation, it is assumed that the memory unit C11 is to be programmed. A first program selected bias with an upper bound and a lower bound (e.g., 5V~12V) is applied to the word line WL3 corresponding to the memory unit C11 to be programmed by applying ISPP, and a first program de-selected bias (e.g., 0V) is applied to the other word lines. A second program selected bias (e.g., −8V) is applied to the source line SL3 corresponding to the memory unit C11 to be programmed, and a second program de-selected bias (e.g., 2V) is applied to the other source lines. The second program selected bias (e.g., −8V) is applied to the bit line BL3 corresponding to the memory unit C11 to be programmed, and the second program de-selected bias (e.g., 2V) is applied to the other bit lines. Noted that the first program selected bias is positive, the second program selected bias is negative, and the second program de-selected bias is positive. Applying ISPP on the programming operation could make the probability distribution of the threshold voltage of the programmed memory unit tight. In this embodiment, the memory unit to be programmed may suffer a bias of 20V, and the memory units not to be programmed may suffer a bias −2V or 10V.

To conclude, the 3D flash memory according to the present invention has benefit of high integration. The first source/drain pillars and the second source/drain pillars are made of P-type doped material so that the problem of over erasing could be out of concern. Thereby, the erase operation could be performed in one-shot pulse. Furthermore, the time consumed for erasing is shortened.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. 3D flash memory, comprising:
    a gate stack structure, disposed on a dielectric base, and comprising a plurality of gate layers electrically insulated from each other;
    an annular channel pillar disposed on the dielectric base and penetrating through the gate stack structure;
    a first source/drain pillar and a second source/drain pillar, disposed on the dielectric base, at least a part located within the annular channel pillar, and penetrating through the gate stack structure, wherein the first source/drain pillar and the second source/drain pillar are separated from each other and are each connected to the annular channel pillar; and
    a charge storage structure, disposed between each of the plurality of gate layers and the annular channel pillar, wherein a material of the first source/drain pillar and the second source/drain pillar are P-type doped semiconductor, and the first source/drain pillar, the second source/drain pillar, the charge storage structure, the annular channel pillar and the gate layers form a plurality of memory units.

2. The 3D flash memory according to claim 1, wherein the gate layer of each of the memory unit is electrically connected to a gate control line, the first source/drain pillar is electrically connected to a first signal line, and the second source/drain pillar is electrically connected to a second signal line.

3. The 3D flash memory according to claim 1, wherein the material of the first source/drain pillar and the second source/drain pillar are Boron-doped.

4. The 3D flash memory according to claim 1, wherein the first source/drain pillar and the second source/drain pillar are respectively disposed on two opposite sides of an isolation pillar.

5. The 3D flash memory according to claim 4, wherein the isolation pillar is an silicon nitride layer.

6. The 3D flash memory according to claim 1, wherein the plurality of gate layers are electrically insulated from each other by a plurality of insulating layers, and the charge storage structure is lining on the interface between the plurality of gate layers and the annular channel pillar as well as the plurality of insulating layers.

7. The 3D flash memory according to claim 1, wherein the first source/drain pillar and the second source/drain pillar is located within the annular channel pillar.

8. An operation method applied to the 3D flash memory according to claim 2, comprising:
    applying a first read selected bias to the gate control line corresponding to the memory unit to be read; and
    applying a second read selected bias to the first signal line corresponding to the memory unit to be read,
    wherein the first read selected bias is more negative to the second read selected bias.

9. The operation method according to claim 8, further comprising:
    applying 0V to the other gate control lines;
    applying 0V to the second signal line corresponding to the memory unit to be read;
    floating the other second signal lines; and
    floating the other first signal lines.

10. An operation method applied to the 3D flash memory according to claim 2, comprising:
    applying a first erase selected bias to the gate control line corresponding to the memory unit to be erased;
    applying a second erase selected bias to the first signal line corresponding to the memory unit to be erased; and
    applying the second erase selected bias to the second signal line corresponding to the memory unit to be erased,
    wherein the first erase selected bias is negative, and the second erase selected bias is positive.

11. The operation method according to claim 10, further comprising:
    applying a first erase de-selected bias to the other gate control lines; and
    applying a second erase de-selected bias to the other first signal lines and the other second signal lines, wherein the first erase de-select bias is higher than the first erase selected bias, and the second erase de-selected bias substantially equals to the second erase selected bias.

12. An operation method applied to the 3D flash memory according to claim 2, comprising:
  applying a first program selected bias to the gate control line corresponding to the memory unit to be programmed;
  applying a second programmed selected bias to the first signal line corresponding to the memory unit to be programmed; and
  applying the second program selected bias to the second signal line corresponding to the memory unit to be programmed;
  wherein the first program selected bias applies ISPP and is positive, and the second program selected bias is negative.

13. The operation method according to claim 12, further comprising:
  applying a first program de-selected bias to the other gate control lines; and
  applying a second program de-selected bias to the other first signal lines and the other second signal lines,
  wherein the first program de-select bias is lower than the first program selected bias, and the second erase de-selected bias is negative.

* * * * *